US006212487B1

(12) United States Patent
Sakamoto

(10) Patent No.: US 6,212,487 B1
(45) Date of Patent: *Apr. 3, 2001

(54) METHOD AND APPARATUS OF ESTABLISHING A REGION TO BE MADE AMORPHOUS

(75) Inventor: Hironori Sakamoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/037,852

(22) Filed: Mar. 10, 1998

(30) Foreign Application Priority Data

Mar. 10, 1997 (JP) .................................................. 9-054397

(51) Int. Cl.[7] ...................................................... G06F 17/50
(52) U.S. Cl. ................................................. 703/12; 703/9
(58) Field of Search ........................ 395/500.27, 500.33, 395/500.23; 703/9, 12, 13

(56) References Cited

U.S. PATENT DOCUMENTS

| 5,242,507 | * | 9/1993 | Iverson | 148/33 |
| 5,859,784 | * | 1/1999 | Sawahata | 364/578 |
| 5,868,831 | * | 2/1999 | Dornberger et al. | 117/15 |

FOREIGN PATENT DOCUMENTS 6-196539    10/1994    (JP) ................................ H01L/21/66

OTHER PUBLICATIONS

Tian S et al: "Monte Carlo Simulation of 1,2 6 ion implantation damage process in silicon" International Electron Devices Meeting. Technical Digest (Cat. No. 96CH35961), International Electron Devices Meeting. Technical Digest, San Francisco, CA, USA, Dec. 8–11, 1996, pp. 713–716, XP002126344 1996, New York, NY, USA, IEEE, USA ISBN: 07–7803–3393–4.

Mulvaney B J et al: "Pepper—a process simulator for VLSI" IEE Transactions on Computer–Aided Design of Integrated Circuits and Systems, Apr. 1989, USA, vol. 8, No. 4, pp. 336–349, XP002126345 ISSN: 0278–0070.

Baccus B et al: "Modeling high–concentration boron diffusion under amorphizaiton conditions" Journal of Applied Physics, Jun. 1, 1995, USA, vol. 77, No. 11, pp. 5630–5641, XP000861534 ISSN: 0021–8979.

"Process Device Simulation Technology", ed. Dan Ryo, Sangyo Tosho, Apr. 20, 1990, pp. 44–61. (No English Version).

Hane et al., "A Model For Boron Short Time Annealing After Ion Implantation", *IEEE Transactions on electron Devices*, vol. 40(7):1215–1222, (1993).

Cerva et al., "Comparison of Transmission Electron Microscope Cross Sections of Amorphous Regions in Ion Implanted Silicon with Point–Defect Density Calculations" *J. Electrochem. Soc.* 139:3331–3338 (1992).

* cited by examiner

*Primary Examiner*—Kevin J. Teska
*Assistant Examiner*—Thai Phan
(74) *Attorney, Agent, or Firm*—Foley & Lardner

(57) ABSTRACT

In a method of accurately determining an area that has been changed to an amorphous state which uses a computer simulation of a semiconductor manufacturing process, the impurity concentration at the crystalline-amorphous boundary is taken as the parameter C.

The value obtained by dividing the implanted ion concentration obtained by means of an ion implantation simulator by the parameter Ca is defined as the amorphous conversion ratio parameter, and a region in which this amorphous conversion ratio parameter is 1 or greater is taken to be an area that is converted to an amorphous state.

9 Claims, 4 Drawing Sheets

METHOD AND APPARATUS OF ESTABLISHING A REGION TO BE MADE AMORPHOUS

BACKGROUND OF THE INVENTION

1. Field of the Invention

The present invention relates to a computer simulation method for a semiconductor device manufacturing process, and more specifically to a method for establishing a region that is changed to an amorphous state.

2. Description of Related Art

There has been an attempt made to optimize a semiconductor device manufacturing process, such as, for example, LSI or the like, by means of a process simulator.

The term process simulator in this sense refers to the calculation, using a computer, of a semiconductor device manufacturing process such as an ion implantation process or diffusion process, and the prediction of physical quantities and shapes of the device's internal impurities profile and the like.

If a process is optimized by using a process simulator so that the semiconductor device exhibits the best electrical characteristics, it is possible to make a great reduction of both cost and required time in comparison with actually fabricating prototypes of semiconductor devices, for example, LSI devices.

Because the internal physical quantities in a semiconductor device are calculated by a process simulator, it is possible to analyze the behavior of impurities within the semiconductor.

A detailed description of a process simulator is presented pages 18 to 79 of "Process Device Simulation Technology" (published by Sangyo Tosho), edited by Dan Ryo, which was published on Apr. 20, 1990.

In a diffusion simulation which is used for the purpose of calculating a diffusion process, it is necessary to solve the diffusion equations for each of the impurities which express the behavior of the impurities within the semiconductor.

It has been reported that point defects in inter-lattice silicon occurring because of ion implantation and at holes and the like can interact with implanted ions so as to accelerate the diffusion of impurities, in the IEEE Transactions on Electron Devices, Vol. 40, No. 7, pages 1215 to 1222, in H. Hane and H. Matsumoto "A Model for Boron Short Time Annealing After Ion Implantation" published July 1993, and to calculate this type of phenomenon using a computer, it is necessary also to simultaneously solve the diffusion equation for point defects in inter-lattice silicon and holes or the like occurring because of ion implantation.

In a region in which ion implantation causes a large number of point defects, because of a collapse of the crystalline structure, there is a change to an amorphous state.

In a region that has changed to an amorphous state, because the initial conditions of impurities and point defects and the like are different from the crystalline region, to achieve an accurate simulation of the impurity diffusion, it is necessary to accurately establish the region in which the change to an amorphous state has occurred.

In the past, as noted in H. Cerva and G. Hobler, "Comparison of Transmission Electron Microscope Cross Sections of Amorphous Regions in Ion Implanted Silicon with Point-Defect Density Calculations" (Journal of Electrochemical Society, Vol. 139, No. 12, p. 3631–3638, December, 1992), a method of establishing a region that has become amorphous by using the point-defect density that occurs due to ion implantation was used.

In this method, as shown in FIG. 3, the region in which the point-defect density 21 that occurs because of ion implantation is at or above some density $D\alpha$ is taken as the region that has become amorphous.

Using the prior art, it is difficult to improve the accuracy of establishing the region that has become amorphous.

The reason for this is that the point-defect density occurring because of ion implantation is used to establish the region that has become amorphous.

Since the actual measurement of the point-defect density is difficult, it is difficult to know its precise value, this making it necessary to determine it by means of ion implantation simulation, which not only is highly dependent upon the ion implantation simulator model and parameters, but also because these models include approximations it is difficult to obtain parameters to accurately establish the region that has become amorphous.

In view of the above-described drawbacks in the prior art, an object of the present invention is to provide a method of establishing the region that has become amorphous which is capable of determining this region accurately.

SUMMARY OF THE INVENTION

To achieve the above-noted object, the present invention provides a method of establishing, by means of a computer simulation of a semiconductor device manufacturing process, a region that has become amorphous, and in the method of establishing a region that has become amorphous, the region that has become amorphous is determined by detecting a relationship formed between an impurity concentration at an interface formed between crystal and amorphous regions (referred to amorphous/crystalline (a/c) interface, hereunder) and an ion implantation concentration of the ion of the impurity being implanted thereinto calculated by means of the computer simulation.

In the method of establishing, by means of a computer simulation of a semiconductor device manufacturing process, a region that has become amorphous, in the present invention, the method specifically comprises the steps of; taking an impurity concentration at an amorphous/crystalline (a/c) interface, as a parameter $C\alpha$; determining an ion implantation concentration of the ion which is implanted thereinto by means of the computer simulation; defining an amorphous conversion ratio parameter $R\alpha$ as the ion implantation concentration divided by the parameter $C\alpha$; and determining the region that has been converted to an amorphous state at the time of ion implantation, as a region in which the amorphous conversion ratio parameter $R\alpha$ is 1 or greater.

There are a plurality of above-noted ion implantation conditions, the impurity concentration at the crystal-amorphous boundary being measured for a specific number of conditions, interpolation or extrapolation from these measured values being used to predict values which are used as the above-noted parameter $C\alpha$ with respect to each of the conditions.

It is preferable when ion implantation is done a number of times, including cases in which the type of impurity is different, that the sum of the amorphous conversion ratios $R\alpha$ with respect to each of the ion implantations be taken, the region in which this value is 1 or greater being taken as the region which became amorphous at the time of ion implantation.

DETAILED DESCRIPTION OF THE PREFERRED EMBODIMENTS

Embodiments of present invention are described below, with reference being made to the relevant accompanying drawings.

Figure 1:
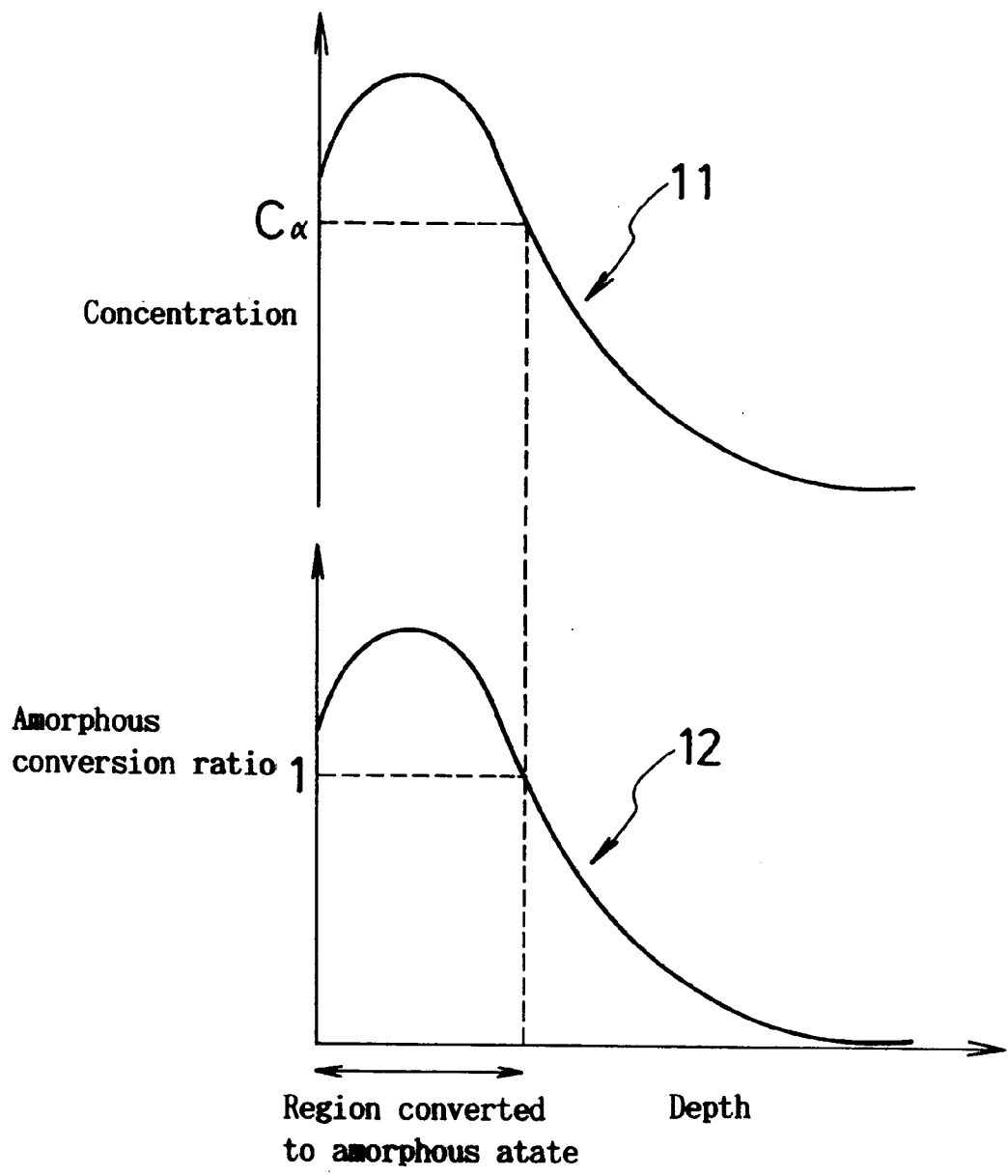
FIG. 1 is a drawing which shows in schematic fashion the first embodiment of a method of establishing a region that has become amorphous according to the present invention.

FIG. 1 shows, in schematic fashion, the first embodiment of the present invention, which is a method of establishing a region that is changed to the amorphous state at the time of ion implantation.

In this embodiment, the implanted ion concentration at the amorphous/crystalline (a/c) interface is measured with respect to each of the ion implantation conditions, such as the ion type, the implanted ion dose, the implantation energy and the implantation angle or the like, and then these measured values being taken as the parameter $C\alpha$.

$C\alpha = C$ (actual measured ion concentration value at the amorphous/crystalline (a/c) interface Because there are countless ion implantation conditions, after making measurements for the certain number of ion implantation conditions required to obtain the required accuracy, interpolation or extrapolation is performed with respect to these measured values to predict a parameter value $C\alpha$ for each of the ion implantation conditions.

Next, the implantation ion concentration C simulation 11 is determined for implanted ions, using an ion simulator, the value of the amorphous conversion ratio parameter $R\alpha$, which is obtained by dividing this implanted ion concentration by the above-noted parameter $C\alpha$, being defined as the amorphous conversion ratio parameter 12.

$$R_\alpha = \frac{C \text{ simulation}}{C_\alpha}$$

Then, the region in which the above-noted amorphous conversion ratio parameter is 1 or greater is taken to be the region of conversion to the amorphous state.

In the present invention, there are many conditions for carrying out the ion implantation so that ion of impurities are implanted into a substrate and thus the concentration of the ion impurities should basically be calculated under all of the possible ion implanting conditions, respectively.

Therefore, in the present invention, regarding each one of the plurality of conditions for the ion implantation, the values of impurity concentration at the amorphous/crystalline (a/c) interface with respect to each one of specific conditions thereof is measured previously and each one of the values of impurity concentration thereat, thus measured, is stored in a suitable memory means.

And when a region that has become amorphous, is determined, a parameter $C\alpha$ with respect to the specific condition is calculated first by using a value predicted by performing interpolation or extrapolation of a plurality of the measured values stored in the memory means, and each of which having a condition being closer to the condition.

In the above-mentioned embodiment of the present invention, the memory means may be some kind of a look-up table in that a plurality of the above-mentioned data concerning the concentration of impurities are listed.

The second embodiment of the present invention will now be described, with reference being made to FIG. 2.

Figure 2:
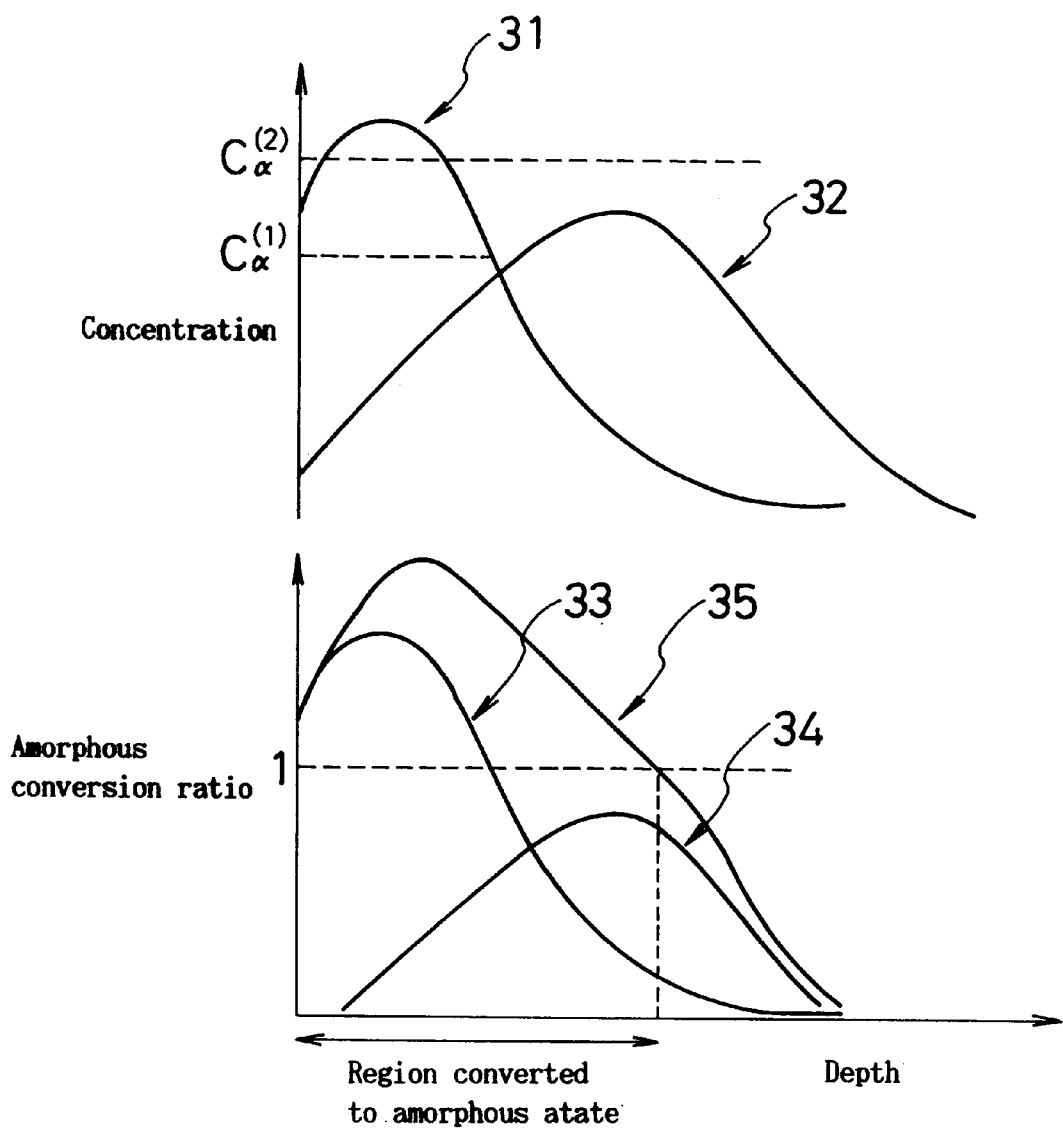
FIG. 2 is a drawing which shows in schematic fashion the second embodiment of a method of establishing a region that has become amorphous according to the present invention.
Figure 3:
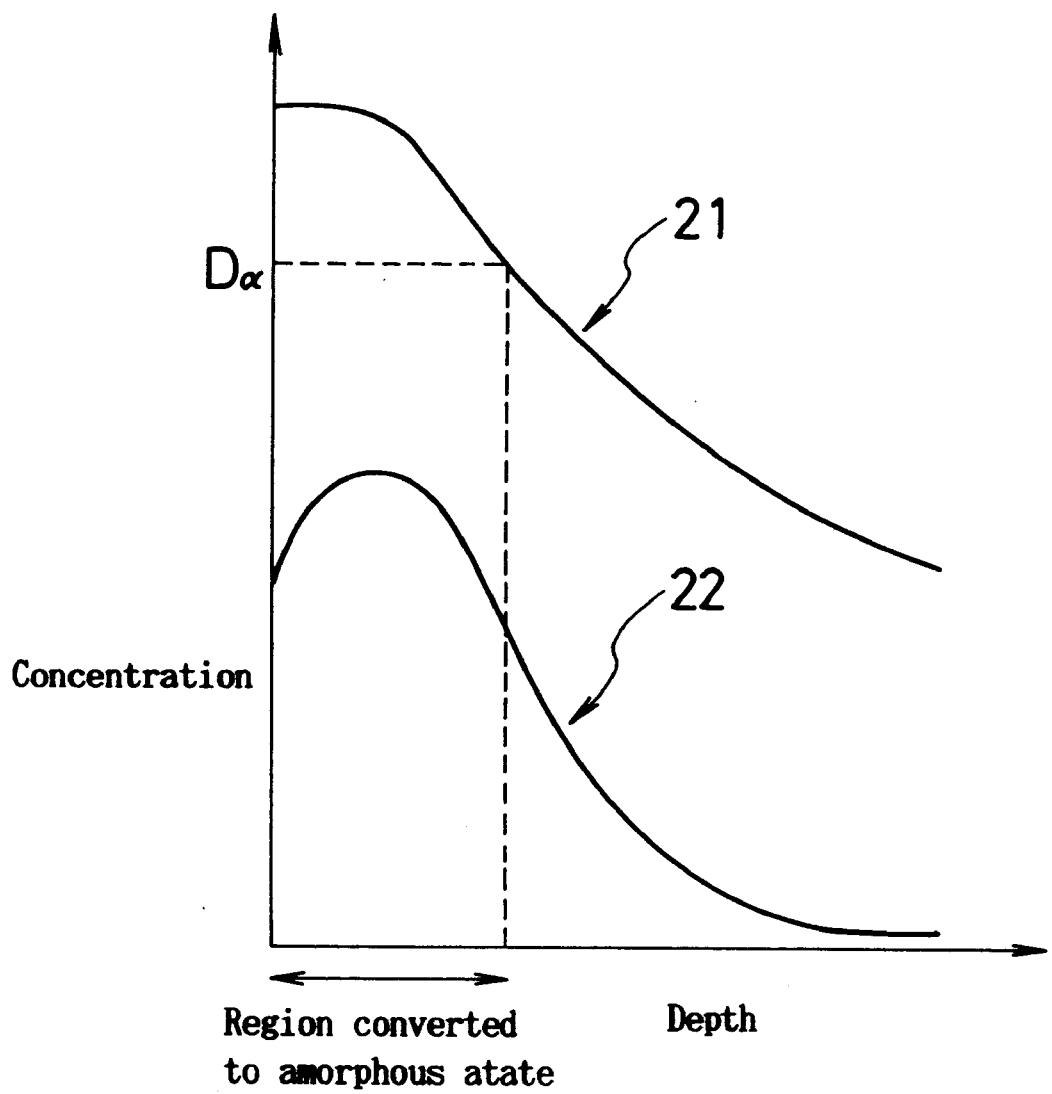
FIG. 3 is a drawing which shows in schematic fashion the method of establishing a region that has become amorphous used in the past.

FIG. 2 shows, in schematic fashion, the first embodiment of the present invention, which is a method of establishing a region that is changed to the amorphous state at the time of ion implantation.

It differs with the first embodiment in that ion implantation is performed a plurality, or a number of times.

In this embodiment, the distribution of the implantation ion concentration C(i) simulations 31 and 32 is determined, using an ion implantation simulator, after which the values R(i)$\alpha$ 33 and 34, which are these implantation concentrations divided respectively by the parameters C(i)$\alpha$ that corresponds to each of the ion implantation conditions, are obtained.

$$R(i)_\alpha = \frac{C(i) \text{ simulation}}{C(i)_\alpha}$$

In the above equation, (i) indicates an element that corresponds to the i-th ion implantation of the plurality of ion implantations that are done.

In this embodiment, the amorphous conversion ratio parameter $R\alpha$ 35 is determined as the sum of R(i)$\alpha$, as shown hereunder, and the region in which that value is 1 or greater is taken as the region that is converted to the amorphous state.

$$R_\alpha = \sum_i R(i)_\alpha$$

In this embodiment of the present invention, as explained above, in the method of establishing a region that has become amorphous, when plurality of ion implantations are done, including a case in which there are different types of impurities, a sum of the amorphous conversion ratio parameters with respect to each ion implantation is taken, and a region in which the sum is 1 or greater is determined as a region that has been converted to an amorphous state at the time of ion implantation.

On the other hand, in the present invention, an apparatus for establishing a region that has become amorphous by means of a computer simulation of a semiconductor device manufacturing process, can be presented.

Figure 4:
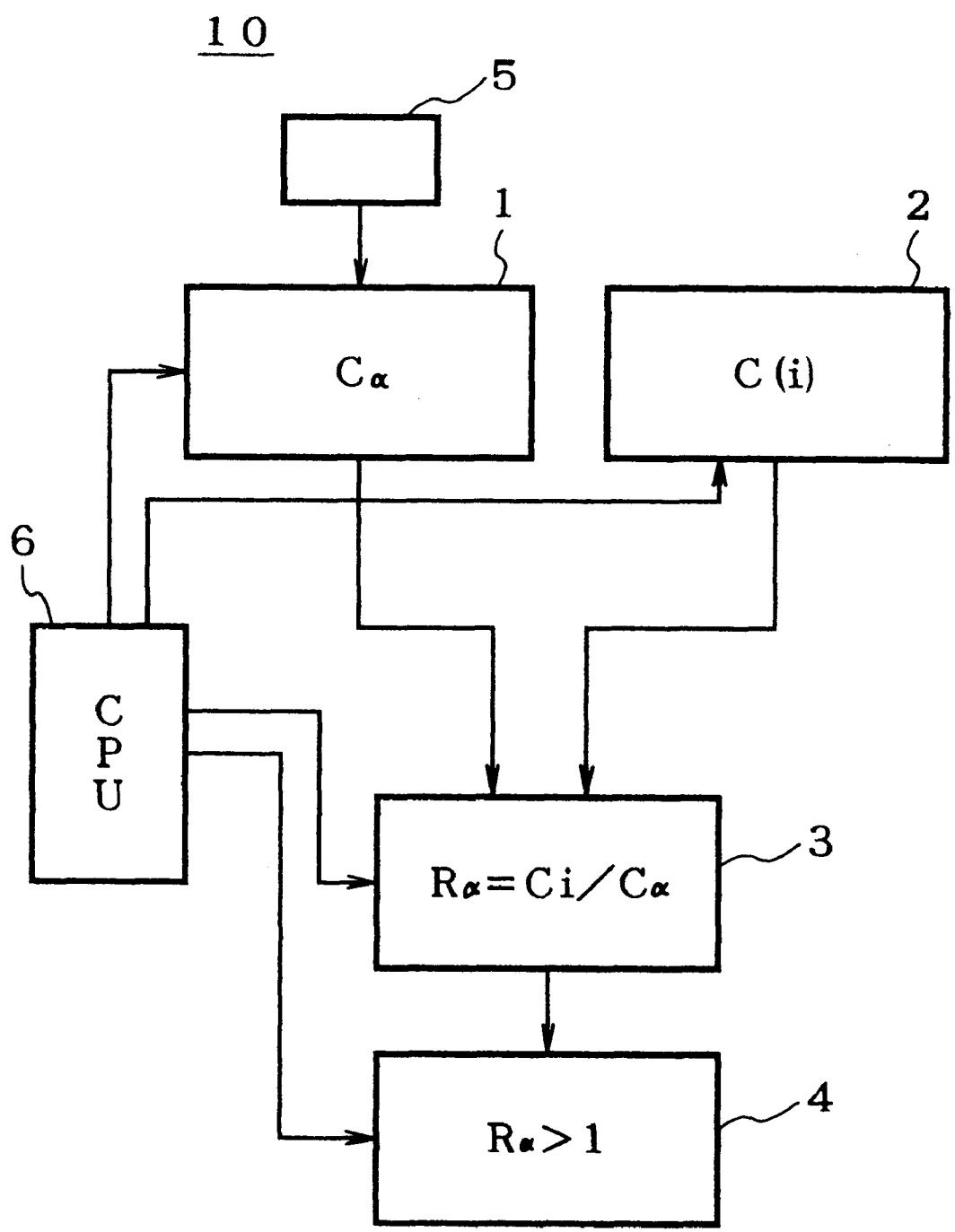
FIG. 4 is a block diagram showing one embodiment of an apparatus for establishing a region that has become amorphous by means of a computer simulation of a semiconductor device manufacturing process, in the present invention.

Note that as shown in FIG. 4, the apparatus 10 for establishing a region that has become amorphous by means of a computer simulation of a semiconductor device manufacturing process, comprises a device 1 for measuring an impurity concentration at an interface formed between crystal and amorphous regions ( amorphous/crystalline (a/c) interface), and determining the measured impurity concentration thereat as a parameter $C\alpha$, a device 2 for simulating an ion implantation concentration of the ion of the impurity which is implanted thereinto by utilizing a computer, a device 3 for calculating a value of ratio obtained from the ion implantation concentration divided by the parameter $C\alpha$, and determining the ratio as an amorphous conversion ratio parameter Rα, and a device 4 for determining a region in which the amorphous conversion ratio parameter Rα thereof is 1 or greater, as a region that has been converted to an amorphous state at the time of ion implantation amorphous state at the time of ion implantation.

The apparatus 10 of the present invention further comprises a memory device 5 and a central controlling device 6, such as CPU or the like.

The memory device 5 used in the present invention is to store a plurality of impurity concentrations at an interface formed at the amorphous/crystalline (a/c) interface, measured at each one of specific conditions among a plurality of conditions.

In accordance with the above-noted as described above, there is an improvement in the accuracy of determining the region converted to the amorphous state. By doing this, the practical usefulness of a process simulator is improved.

The reason for the above-noted effect is that, with the impurity concentration at the crystalline-amorphous boundary as a parameter, the region converted to the amorphous state is determined using the implanted ion concentration derived from an ion simulator with sufficient accuracy.

What is claimed is:

1. A method of establishing, by utilizing a computer simulation of a semiconductor device manufacturing process, a region that has become amorphous, said method comprising the steps of:

determining an impurity concentration at an interface formed between a crystal and an amorphous region, as a parameter Cα;

determining an ion implantation concentration of an ion of said impurity concentration which is implanted thereinto by utilizing said computer simulation;

defining an amorphous conversion ratio parameter Rα as said ion implantation concentration divided by said parameter Cα; and locating said amorphous region by determining said region that has been converted to an amorphous state at the time of ion implantation, as a region in which said amorphous conversion ratio parameter Rα is at least 1.

2. A method of establishing a region that has become amorphous according to claim 1, comprising a plurality of conditions for said ion implantation, and further comprising the steps of:

measuring the values of impurity concentrations at said interface formed between said crystal and said amorphous regions, with respect to specific conditions of said plurality of conditions, and using values predicted by performing at least one of an interpolation and an extrapolation of said measured values as said parameter Cα with respect to each condition.

3. A method of establishing a region that has become amorphous according to claim 2, further comprising the steps of:

measuring previously for each one of said plurality of conditions for said ion implantation, the values of impurity concentration at said interface formed between said crystal and amorphous regions, with respect to each one of a plurality of specific conditions thereof, and storing each one of said values of impurity concentration thereat, thus measured, in a suitable memory device; and further wherein determining a region that has become amorphous, by using a parameter Cα with respect to the specific condition, calculated by using a value predicted by performing said at least one of an interpolation and an extrapolation of a plurality of said measured values stored in said memory device, and each of which having a condition being closer to said condition.

4. A method of establishing a region that has become amorphous according to claim 1, wherein a plurality of ion implantations are performed further comprising the steps of:

calculating a sum of said amorphous conversion ratio parameters with respect to each ion implantation, and determining a region in which said sum is at least 1 is determined as a region that has been converted to an amorphous state at the time of ion implantation.

5. A method for establishing a region that has become amorphous as recited in claim 4, wherein said plurality of ion implantations comprise different types of impurities.

6. A method for establishing a region that has become amorphous as recited in claim 1, further comprising utilizes a computer memory and a look up table for determining Cα.

7. An apparatus, for establishing a region that has become amorphous by utilizing a computer simulation device of a semiconductor device manufacturing process, said apparatus comprising:

a device for measuring an impurity concentration at an interface formed between a crystal region and an amorphous region, and determining said measured impurity concentration thereat as a parameter Cα;

a device for simulating an ion implantation concentration of an ion of said impurity concentration which is implanted thereinto by utilizing a computer;

a device for calculating a value of ratio obtained from said ion implantation concentration divided by said parameter Cα, and determining said ratio as an amorphous conversion ratio parameter Rα; and a device for locating said amorphous region by determining a region in which said amorphous conversion ratio parameter Rα thereof is at least 1, as a region that has been converted to an amorphous state at the time of ion implantation amorphous state at the time of ion implantation.

8. An apparatus for establishing a region that has become amorphous according to claim 7, wherein said apparatus is further provided with a memory device for storing a plurality of impurity concentrations at an interface formed between a crystal region and an amorphous region, measured at each one of a plurality of specific conditions among a plurality of conditions.

9. An apparatus for establishing a region that has become amorphous as recited in claim 7, wherein said Cα determination utilizes a computer memory and a look up table.

* * * * *